United States Patent [19]
Emori

[11] Patent Number: 4,748,346
[45] Date of Patent: May 31, 1988

[54] DRIVER FOR DIFFERENTIAL SIGNAL TRANSMISSION

[75] Inventor: Shinji Emori, Urawa, Japan

[73] Assignee: Fujitsu Limited, Kawasaki, Japan

[21] Appl. No.: 683,495

[22] Filed: Dec. 19, 1984

[30] Foreign Application Priority Data

Dec. 23, 1983 [JP] Japan .................. 58-243474

[51] Int. Cl.$^4$ ............... H03K 3/01; H03K 17/16; H03K 19/086; G06G 7/12
[52] U.S. Cl. ................... 307/270; 307/443; 307/475; 307/494; 307/455
[58] Field of Search ............... 307/270, 494, 542, 544, 307/475, 555, 565, 549, 551, 455, 467, 443, 454, 254, 440, 445, 467, 362, 355, 473, 11; 330/252, 257, 258

[56] References Cited

U.S. PATENT DOCUMENTS

| | | | |
|---|---|---|---|
| 3,780,316 | 12/1973 | Wilhelm | 307/254 |
| 4,131,808 | 12/1978 | Kuo | 307/270 |
| 4,286,179 | 8/1981 | Konian et al. | 307/270 |
| 4,437,021 | 3/1984 | Sumi et al. | 307/494 |

FOREIGN PATENT DOCUMENTS

| | | | |
|---|---|---|---|
| 2027515 | 6/1970 | Fed. Rep. of Germany | |
| 0008741 | 1/1977 | Japan | 307/362 |

OTHER PUBLICATIONS

Patents Abstracts of Japan, vol. 7, No. 276, (E-215)[1421], Dec. 9, 1983; & JP-A-58 154 923, (Matsushita Denki Sangyo K.K.), 9-14-83.
IBM Technical Disclosure Bulletin, vol. 21, No. 9, Feb. 1979, pp. 3607, 3608, New York; E. L. Carter: "Cascode Clock Driver", European Search Report, The Hague, 3-13-87.
H. C. Lin, "Integrated Electronics", 1967, p. 229.
H. D. Varadarajan, "Programmable Swing Current Switch for Low-Power High-Speed Circuits", Mar. 1977, IBM Technical Disclosure Bulletin, vol. 19, No. 10, pp. 3736-3737.
V. L. Gani and F. A. Montegari, "Bilevel Line Driver and Receiver", Nov. 1974, IBM Technical Disclosure Bulletin, vol. 17, No. 6, pp. 1616-1617.

*Primary Examiner*—Stanley D. Miller
*Assistant Examiner*—Trong Quang Phan
*Attorney, Agent, or Firm*—Staas & Halsey

[57] ABSTRACT

A driver for transmitting a digital differential signal along a transmission line during a packet time and not during an idle time while maintaining a constant common voltage between the transmission line and ground throughout the packet and idle time periods. A driving circuit and its drive controller in the driver and respectively formed from paired matched transistors which function as on-off switching circuits and have a common emitter load acting as a constant current source. A collector of a first transistor in the drive controller is connected to the common emitter of the driving circuit and a collector of a second transistor in the drive controller is respectively connected to the collectors of the pair of transistors of the driving circuit through respective matched diodes. During the idle time, the driving circuit is cut off by the first transistor being cut off, and the second transistor carries collector current, which is separated into halves, through respective matched collector resistors in the driving circuit and the matched diodes. The voltage on each collector in the pair of transistors in the driving circuit becomes the mean value of a high and a low voltage levels produced during the packet time. The constant common voltage can be obtained from this mean voltage by using emitter followers. Matched transistors can be used instead of the matched diodes.

7 Claims, 4 Drawing Sheets

DRIVER FOR DIFFERENTIAL SIGNAL TRANSMISSION

BACKGROUND OF THE INVENTION

The present invention relates to a driver for transmitting a digital differential signal, more particularly, it relates to a driver which can remove a common mode signal reflection which occurs in a transmission line and produces errors in signal transmission.

A digital differential signal is used for signal transmission in systems such as a local area network (LAN) system, and is used for protecting a signal being transmitted through a transmission line, such as a twisted wire pair, from electric noise which is received from outside the transmission line. As shown in FIG. 1, a transmission system for the digital differential signal consists of a driver 10, a transmission line X-$\overline{\text{X}}$, and a transformer 12. Input digital differential signal D-$\overline{\text{D}}$ drives the driver 10 producing digital differential signal outputs on the transmission line X-$\overline{\text{X}}$. The transmission line X-$\overline{\text{X}}$ carries the driven digital differential signal toward a receiving side where the transmission line X-$\overline{\text{X}}$ is terminated by the transformer 12. When standard No. 802.3 of the "Institute of Electrical and Electronics Engineers" (IEEE) is applied to the digital differential signal as is typical for the LAN system, the driver 10 in FIG. 1 is included in a "Data Terminal Equipment" (DTE), the transformer 12 is included in a "Medium Attachment Unit" (MAU), and the transmission line X-$\overline{\text{X}}$ corresponds to a "data out line" of an "Attachment Unit Interface" (AUI).

The digital differential signal output has two relevant voltages, a differential voltage and a common voltage. When $V_X$ is the instantaneous voltage on line X and $V_{\overline{X}}$ that on line $\overline{\text{X}}$, the differential voltage $V_{diff}$ is defined as:

$$V_{diff} = V_X - V_{\overline{X}} \quad (1)$$

and the common voltage $V_{comm}$ is defined as:

$$V_{comm} = \frac{V_X + V_{\overline{X}}}{2} \quad (2)$$

In the LAN system, data to be transmitted is encapsulated or grouped, coded, and transmitted as a packet, so the transmission line is either transmitting the packet or in a quiescent state. The time interval during actual transmission is called "packet time" and while the quiescent period is called "idle time". Data is transmitted only during the packet time. During the packet time, the X and $\overline{\text{X}}$ line voltages differentially change to a high (H) or a low (L) levels respectively in accordance with the data to be transmitted. The differential voltage levels of lines X and $\overline{\text{X}}$ do not change during the idle time because there is no signal or data to be transmitted. Furthermore, because the transmission line is terminated by the transformer 12, direct current cannot be allowed to flow through the transformer 12 to avoid saturation of the magnetic core therein. The driver 10 of the prior art will be discussed first with respect to the circuit diagram in FIG. 2 and related waveforms in FIG. 3.

The driver of the prior art, as illustrated in FIG. 2, consists substantially of emitter coupled logic (ECL) circuits to provide high speed operation. The transistors in transistor pairs Q1-Q2, Q5-Q6, and Q7-Q8 in FIG. 2 are matched and formed the ECL circuits along with their common emitter loads Q3, R2 and Q9, R6 which function as constant current sources. Each ECL circuit operates as a switching circuit, for example, in the ECL circuit Q1-Q2, Q2 is cut off when Q1 is on and vice versa because common emitter load Q3 and R2 keeps the current constant. A base voltage $V_{cs}$, for example, 1.2 volts, is applied to Q3 is for proper bias.

Switching circuit Q5-Q6 acts as a driving circuit while transistors Q10 and Q11 are emitter followers which produce the digital differential signal output after receiving a differential output from the driving circuit at their bases. Output terminals T3 and T4 are connected to transmission lines X and $\overline{\text{X}}$ respectively. These circuits comprise a main portion of a circuit for a driver. Added to the main portion of the driver circuit are a packet time detecting circuit and a drive controller. Switching circuit Q1-Q2, transistor Q4, capacitor C, diode D1, and resistors R1 and R3 form the packet time detecting circuit which detects successive periods of packet time and allows the differential voltage on the transmission lines X-$\overline{\text{X}}$ to be gradually shifted to zero when the transmission line changes to the idle time. Switching circuit Q7-Q8 forms the drive controller which controls the driving circuit Q5-Q6 to produce a differential coded data signal during the packet time and to gradually produce a zero differential voltage during the idle time which becomes the initial voltage at the beginning of each packet time.

Details of the operation of the prior art driver circuit will be further explained for a case where "Manchester Coded Data" is the packet data coded according to IEEE Standard No. 802.3, using the waveforms in FIG. 3. In the packet according to the standard, the level of data (transmission line) during the idle time is "1" (D=H) and coded data during the packet time appears as a data train having at least an edge in one bit-time. FIGS. 3(a) and 3(b) respectively illustrate voltages of input signals D at T1 and $\overline{\text{D}}$ at T2 that are applied to switching circuits Q1-Q2 and Q5-Q6; FIGS. 3(c) and 3(d) respectively illustrate voltages of output signals at T3 and T4; FIG. 3(e) illustrates an output differential signal between T3 and T4; FIG. 3(f) illustrates a common voltage between the transmission line X-$\overline{\text{X}}$ and ground; and FIG. 3(g) illustrates periods in which symbol PT indicates packet time, ID1 and ID2 respectively indicate idle time just before and after PT.

During the period ID1, an idle signal (D=H, $\overline{\text{D}}$=L) is applied to T1 and T2, so the driver is in a steady state as follows.

(1-1) As shown in parts a1 and b1 in FIGS. 3(a) and 3(b), the input voltage applied to the base of transistor Q1 is higher than input voltage applied to a base of transistor Q2, so Q1 is ON and Q2 is OFF.

(1-2) Since transistor Q1 is ON, a constant current from a constant current source consisting of Q3 and R2 flows through R1, this produces a voltage drop, based on the amount of constant current and the value of R1, at the collector of Q1. Since Q4, D1 and R3 form an emitter follower circuit, the voltage at the emitter of Q4 becomes $V_{OL}$ which is lower than the Q1 collector voltage by as much as $V_{BE}$ (base-emitter forward voltage 0.8 volt), and a voltage difference of $V_{CC} - V_{OL}$ is applied to capacitor C.

(1-3) By adjusting the base voltage (reference voltage $V_r$, for example, to 3 volts) of Q8 properly, base voltage of Q7 can be set lower than the reference voltage $V_r$ and Q7 will be OFF. The drive controller Q7-Q8 cuts off the driving circuit Q5–Q6. This causes the base voltages of emitter followers Q10 and Q11 to increase to $V_{cc}$, which is, for example, 5 volts.

(1-4) The highest voltage level $V_{OH}$ appears on both output terminals T3 and T4; c1 and d1 in FIGS. 3(c) and 3(d), respectively, illustrate this situation. The differential voltage between X and $\overline{X}$ during period ID1 is zero as shown by e1 in FIG. 3(e). As a result, no direct current flows in the transformer 12 in FIG. 1, so core saturation in the transformer 12 is avoided.

When the period changes from ID1 to PT, an input digital differential signal is applied to terminals T1 and T2 as a pair of waveforms as shown by a3 and b3 in FIGS. 3(a) and 3(b), respectively. The pair of waveforms is standardized according to IEEE Standard No. 802.3. When the driver receives such a digital differential signal, the state of the driver changes as follows.

(2-1) Transistors Q1 and Q2 begin to be switched ON and OFF by the input digital differential signal. Q1 is switched off when initial negative pulse arrives at its base, transistor Q4 outputs a high level, which causes capacitor C to be quickly discharged, and then the base voltage of Q7 in the drive controller Q7–Q8 increases rapidly. Even though the next positive pulse cuts off Q4, the base voltage of Q7 is held high because the circuit including C, D1 and R3 has a large time constant as compared to a bit time that is, a next coded datum of L level is applied to the base of Q1 before the voltage at point A in FIG. 2 decreases. This state is maintained as long as the digital differential signal continues to be received, in other words, during the period of PT. This allows the above circuit to serve as a packet time detector.

(2-2) As Q7 is switched on, the voltage at the emitter of Q8 rises and Q8 is switched off. The drive controller Q7–Q8 controls the driving circuit Q5–Q6 to produce a digital differential signal from the collectors of Q5 and Q6 corresponding to the input differential signal applied to their bases.

(2-3) The emitter followers Q10 and Q11 produce the digital differential signal output as shown by c2 and d2 in FIGS. 3(c) and 3(d), respectively, on the transmission lines X–$\overline{X}$. Reference symbol e2 in FIG. 3(e) indicates the differential voltage between the lines X and $\overline{X}$ during transmission.

When the period changes from PT to ID2, the state of the driver changes as follows.

(3-1) A voltage is applied to the base of Q1 to switch Q1 on, Q4 is cut off and C begins to be charged through D1 and R3 by the power source $V_{cc}$. The base voltage of Q7 gradually decreases and the voltage at point A decreases and remains at the low level.

(3-2) The driving circuit Q5–Q6 tends to return to the same state as in ID1 discussed previously, however before returning to ID1, the following transient phenomena occurs in the circuit. As the Q7 base voltage gradually decreases, its collector current is gradually decreased, which affects the driving circuit Q5–Q6. Nothing happens to Q6 because it has been switched off, however, Q5 is affected because Q5 has been switched on. When the period changes to ID2 from PT at the beginning, the voltage at point A does not decrease at once, and the condition of Q7 being ON and Q8 being OFF is maintained because the base voltage of Q7 is sufficiently higher than that of Q8. After a while, when the voltage at point A decreases so that base voltages of Q7 and Q8 are equal, the current flow gradually changes from flowing in Q7 to flowing in Q8 which can be seen in FIGS. 3(c) and 3(d). In FIG. 3(c), c3 is caused by Q6 being OFF; the flat portion d3 in FIG. 3(d) is caused by Q5 being ON for a while; and the changing part d4 in FIG. 3(d) is caused by Q5 whose collector current gradually decreases. The phenomenon of the portion d4 affects the differential voltage between the transmission lines X and $\overline{X}$, however, the influence appears gradually as shown by e4 in FIG. 3(e).

The differential voltage between the transmission lines consists of only the signals to be transmitted as shown by FIG. 3(e). As far as the FIG. 3(e) is concerned, no signal reflection occurs on the transmission line. However, a variation is concealed in the common voltage of the transmitting signal as shown by FIG. 3(f) which is a steep transient as illustrated by f2. This transient occurs due to the difference in mean voltage between the periods ID1 and PT. The difference can be calculated using the equation (2), as is shown by FIG. 3(f). The steep transient is transmitted by the transmission line X–$\overline{X}$, and makes a round trip between driver 10 and transformer 12 in FIG. 1, because a reflection occurs due to a mismatched common mode impedance at the transformer. It is actually very hard to match common mode impedances perfectly and the reflection of the transient cannot be avoided. Another transient f3 in FIG. 3(f) is gentle, so no reflection occurs. When a reflection occurs, the reflected wave is superimposed on the transmitted digital differential signal and causes unexpected errors in the transmitted signals. This steep variation in the common voltage is a problem in the prior art devices.

SUMMARY OF THE INVENTION

An object of the present invention is to remove reflected signals which occur in a transmission line and produce errors in a digital differential signal transmitted thereover.

Another object of the present invention is to provide a constant common voltage on the transmission line during periods of idle time and packet time.

An additional object of the present invention is to reduce signal transmission errors.

The above objectives can be accomplished using the present invention by providing a driver which includes a driving circuit and a drive controller formed from an emitter coupled logic circuit, an emitter follower circuit and a circuit for producing a common voltage during an idle time which is equal to a mean voltage of a high and a low level for a digital differential signal produced during a packet time. The mean voltage can be achieved by connecting a collector of a transistor in the drive controller to respective collectors of transistors in the driving circuit through respective switching devices such as matched diodes or matched transistors. A collector of another transistor in the drive controller is connected to a common emitter of the transistors in the driving circuit. In this arrangement, the collector current of the transistor connected to the switching devices is separated into halves and flows through respective matched collector resistors in the driving circuit. The respective matched switching devices thereby produce the desired common voltage during the idle time.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
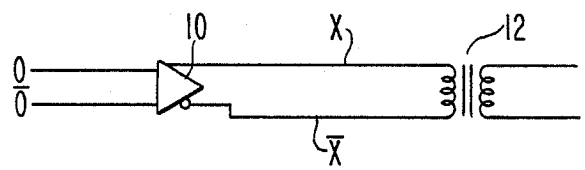
FIG. 1 is a diagram of a digital differential signal transmission system.
Figure 2:
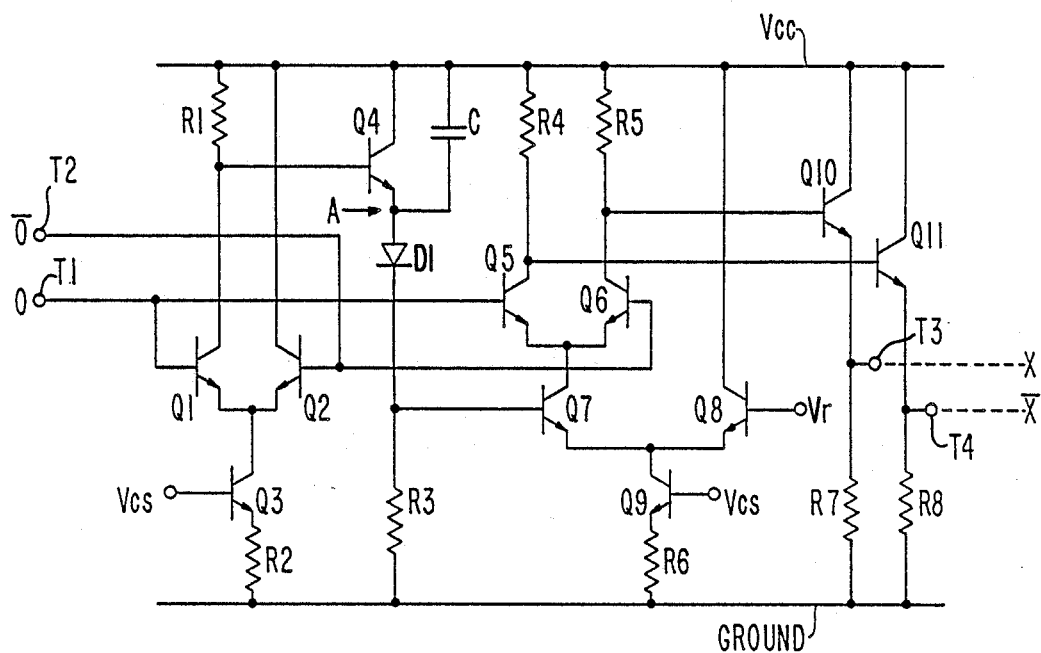
FIG. 2 is a circuit diagram of a prior art driver.
Figure 3:
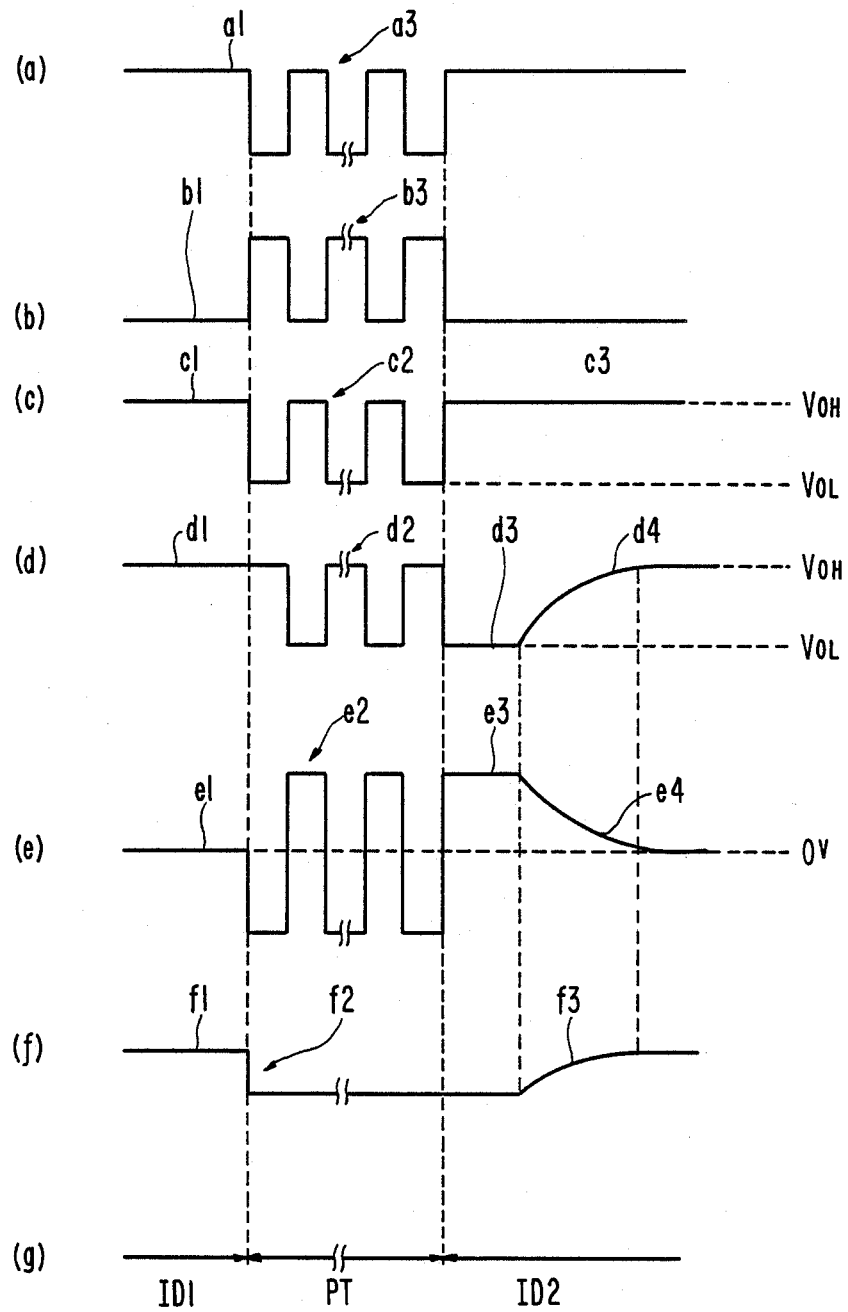
FIGS. 3(a)-3(g) are waveform diagrams illustrating the operation of the prior art driver of FIG. 2.
Figure 4:
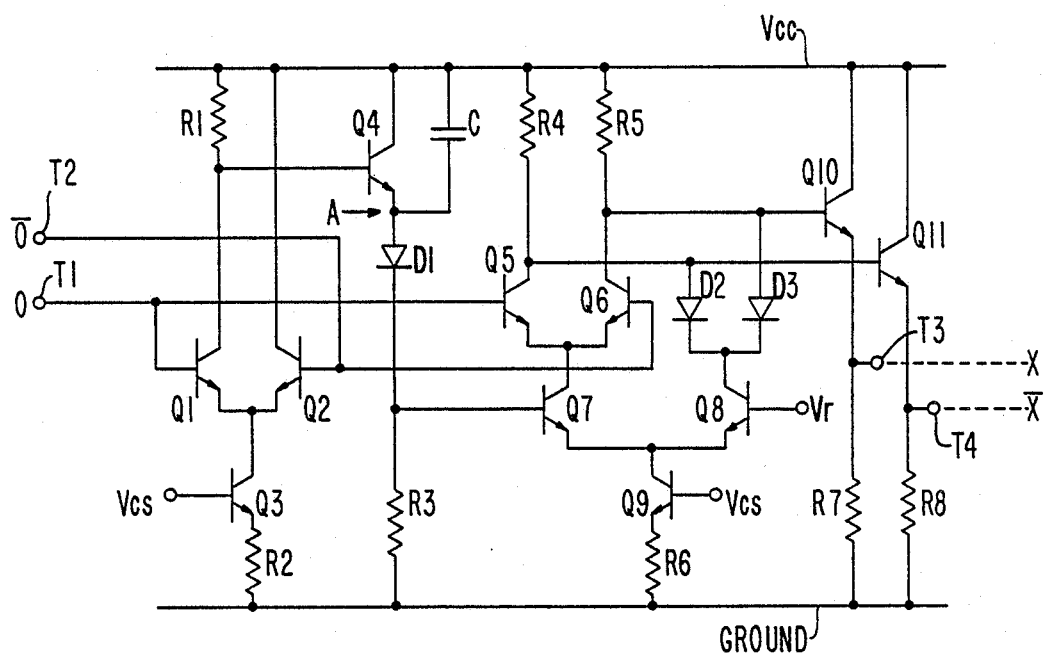
FIG. 4 is a circuit diagram of a driver of an embodiment of the present invention.
Figure 5:
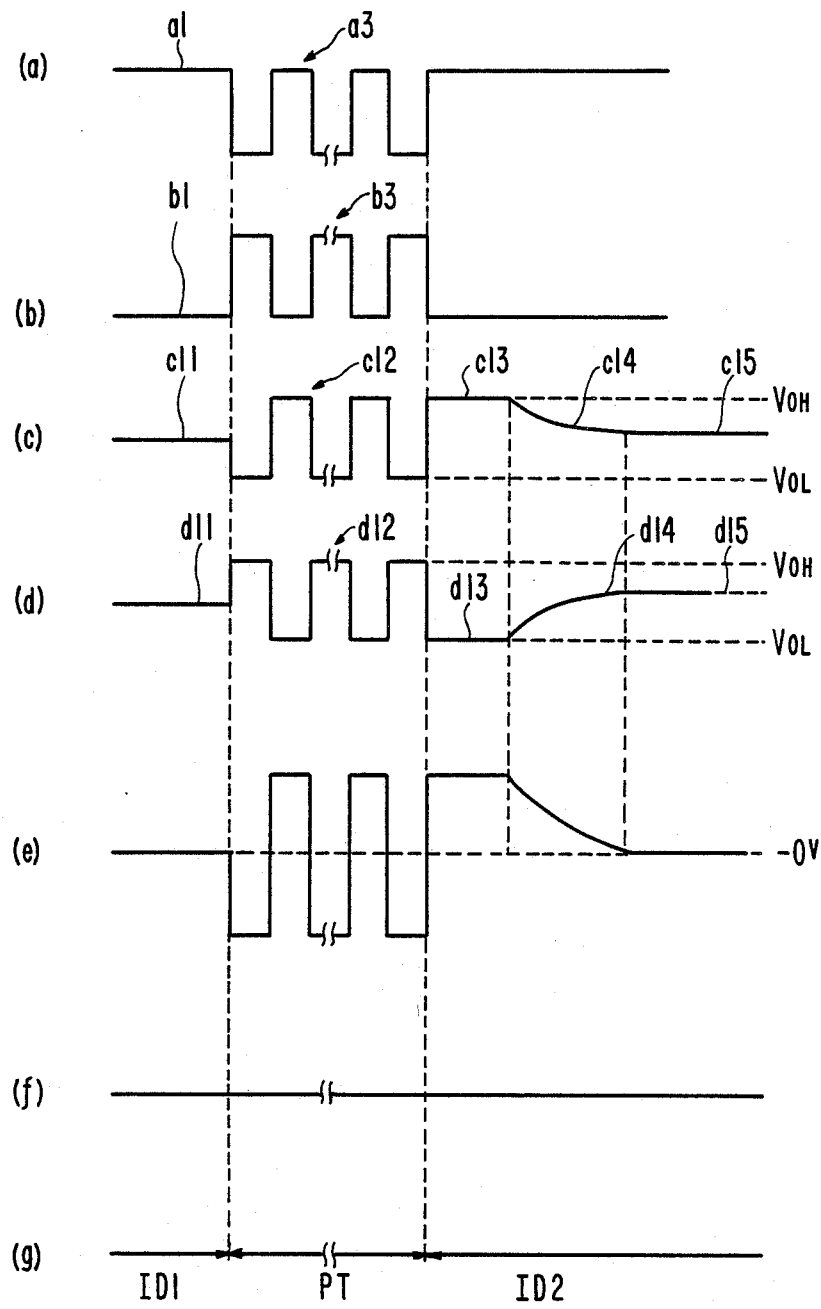
FIGS. 5(a)-5(g) are waveform diagrams illustrating the operation of a driver according to the present invention.

A circuit diagram of a driver for an embodiment of the present invention is depicted in FIG. 4 and waveforms illustrating the operation of the circuit are depicted in FIG. 5. The main function of the circuit of FIG. 4 is the same as that of the prior art circuit of FIG. 2. A digital differential signal input as shown by FIGS. 5(a) and 5(b) is applied to a pair of input terminals T1 and T2 where the terminal T1 is for the input signal of FIG. 5(a) and T2 is the terminal for FIG. 5(b). The input signals are respectively applied to the bases of paired matched transistors Q1–Q2 and Q5–Q6. The paired matched transistors respectively form an ECL circuit and each pair functions as a switching circuit. Transistors Q7–Q8 are also the same type of switching circuit. The switching circuit Q5–Q6 functions as a driving circuit, and emitter followers Q10 and Q11 produce digital differential signals that are applied to transmission line X-$\overline{X}$ at T3 and T4. A packet time detecting circuit which consists of the same elements and provides the same function as in FIG. 2 is also employed. However, the function and structure of the drive controller circuit of FIG. 4 is different from that of the driver control circuit of FIG. 2. A diode D2 is connected between the collectors of Q8 and Q5, and a diode D3 is connected between collectors of Q8 and Q6.

The diodes D2 and D3 provide a constant common voltage at the driver output throughout the periods ID1, PT and ID2. In period ID1, transistor Q7 in the drive controller is cut off as mentioned with respect to FIG. 2, so that the collector circuit does not flow in the driving circuit, however, a current flows in Q8 of the drive controller through R4, D2 and R5, D3 respectively. Resistors R4 and R5 are paired matched collector resistors in the driving circuit Q5–Q6. Half of the constant current of Q9 flows through each of the collector resistors R4 and R5 respectively, so that the voltage drop thereacross is half of the voltage drop that occurs when the full constant current of Q9 flows through R4 and R5 according to the ON or OFF state of the transistors Q5–Q6. As a result, the common voltage of the driver output and produced on the transmission line X-$\overline{X}$ is in the middle between the value $V_{OH}$ and $V_{OL}$. Reference symbols C11 and d11 in respective FIGS. 5(c) and 5(d) illustrate this middle voltage during period ID1.

When the period changes from ID1 to PT, transistor Q7 is switched on as mentioned previously with respect to FIG. 2, then the driver circuit Q5–Q6 and emitter followers Q10–Q11 produce the driver outputs $V_{OH}$ and $V_{OL}$ as illustrated by c12 and d12 in respective FIGS. 5(c) and 5(d).

When the period changes from PT to ID2, the base voltage of Q7 in the drive controller is gradually reduced and eventually Q7 is cut off because the charging current for C which flows through D1 and R3, from the power source as described with respect to FIG. 2. As a common emitter load Q9 and R6 function as a constant current source, and transistor Q8 attempts to turn over the current flow therein to transistor Q7 to keep the current-flow constant. Therefore, while Q7 has a collector current, only Q5 has a collector current and Q6 is cut off, and Q8 is kept off. As a result, flat portions c13 and d13 in FIGS. 5(c) and 5(d) are produced at the driver output. When the collector current of Q7 begins to decrease, this affects the driving circuit so that the Q5 collector current decreases, and at the same time, this affects Q8 so that a collector current beings to flow causing the collector voltage of Q5 to increase and the collector voltage of Q6 to gradually decrease. This steady state can be seen by transient c14 and d14 in FIGS. 5(c) and 5(d). When Q7 is driven to complete cut off, the driving circuit Q5–Q6 is cut off, and Q7 turns the collector current over to Q8 so that the full collector current flows through R4, D2 and R5, D3, respectively, where each resistor carries half the current. This state is maintained until the next period PT occurs. This steady state is indicated by c15 and d15 in FIGS. 5(c) and 5(d).

As a consequence, a differential voltage between the transmission lines X and $\overline{X}$ and a common voltage of the digital differential signal are obtained as shown by FIGS. 5(e) and 5(f), respectively. From the teachings of the figures, it can be seen that a common mode signal reflection does not occur because no common voltage transient is produced, and only the digital differential mode signal is transmitted even though the common mode impedance is mismatched at the end of the transmission line.

Figure 6:
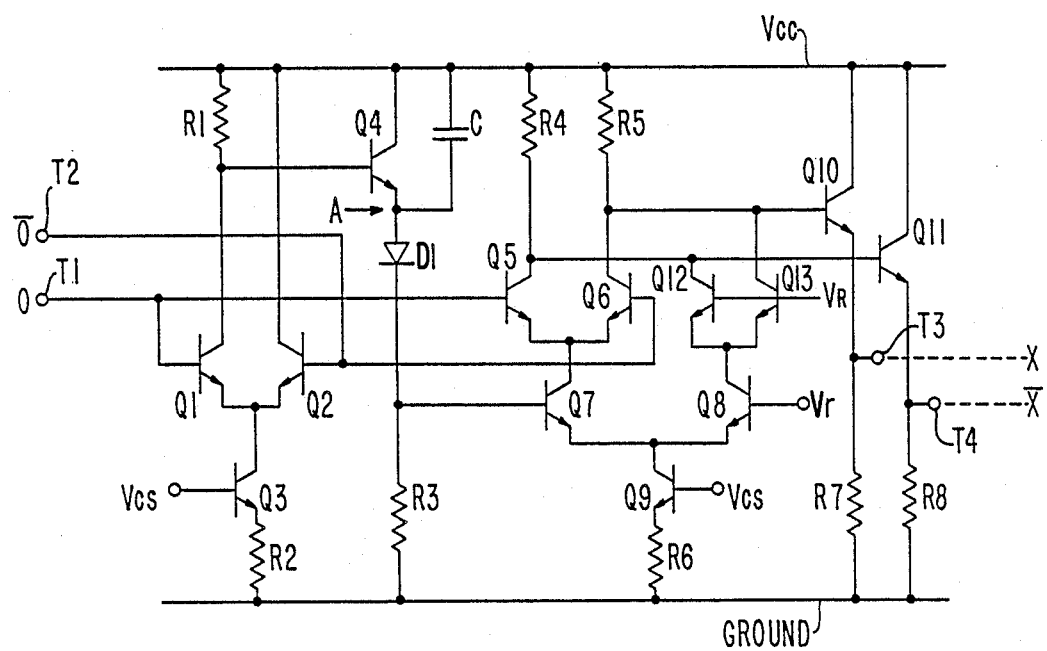
FIG. 6 is a circuit diagram of a driver of another embodiment of the present invention.

A pair of matched transistors Q12 and Q13 can be used instead of the matched diodes D2 and D3 of FIG. 4 as shown by the alternate embodiment of FIG. 6. In this embodiment, the bases of the transistors Q12 and Q13 are connected together and a base voltage $V_R$ which does not allow Q8, Q12 and Q13 to saturate, for example, 3.8 volts, is applied to obtain the constant common voltage.

In the above discussion, the input signal of the driver is the differential signal, however, from the characteristics of the switching circuits Q1–Q2 and Q5–Q6, which compose the ECL circuits respectively, it is clear that the $\overline{D}$ input can be fixed at a reference voltage so that its value is approximately a middle value between the H and L levels of the D input or that the D input can be fixed at a reference voltage that it is approximately half the value between H and L levels of $\overline{D}$ input.

The many features and advantages of the invention are apparent from the detailed specification and thus it is intended by the appended claims to cover all such features and advantages of the circuit which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A driver, having an input transmission line and an output transmission line, for transmitting a digital differential signal having two phases, said driver comprising:
   first and second input terminals coupled to the input transmission line for receiving an input signal;
   first and second output terminals coupled to the output transmission line;
   a power supply;
   a driving circuit for transmitting the digital differential signal from said first and second output terminals as first and second voltage values, said driving circuit including a first pair of emitter coupled transistors each having an emitter, a base and a collector, the base of one transistor in the first pair of emitter coupled transistors coupled to said first input terminal and receiving one phase of the differential signal and the base of the other transistor in the first pair of emitter coupled transistors coupled to said second input terminal and receiving the opposite phase, the emitters coupled together, and the collectors coupled to said power supply via a resistor;
   mean value voltage means, operatively connected to said first and second output terminals, for producing at both the first and second output terminals a voltage value midway between the first and second voltage values when the digital difference signal is not being transmitted, said mean value voltage means comprising:
   a switching controller including a second pair of emitter coupled transistors operatively connected to the coupled emitters of said first pair of emitter coupled transistors; and
   voltage equalization means, operatively connected to the switching controller and the collectors of said first pair of emitter coupled transistors, for providing an equal voltage value at each collector of said first pair of emitter coupled transistors when the digital differential signal is not being transmitted; and
   packet time detecting means, operatively coupled to said first and second inputs, for supplying a first current to the driving circuit by turning on one of the transistors of said second pair of emitter coupled transistors when the level of the input signal received at said first and second input terminals is variable and supplying a second current to said voltage equalization means by turning on the other of the transistors of said second pair of emitter coupled transistors when the input signal is not variable.

2. A driver as recited in claim 1, wherein:
   said first emitter coupled transistor pair comprises first and second transistors; and
   said second emitter coupled transistor pair comprises:
   a third transistor operatively connected to the emitters of said first pair of emitter coupled transistors; and
   a fourth transistor operatively connected to said voltage equalization means, and
   said voltage equalization means comprises:
   a first diode operatively connected between said fourth transistor and the collector of one of the transistors of said first pair of emitter coupled transistors; and
   a second diode operatively connected between said fourth transistor of said second emitter coupled transistor pair and the collector of the other one of the transistors of said first pair of emitter coupled transistors.

3. A driver as recited in claim 1, wherein said first emitter pair comprises first and second transistors;
   said second emitter pair comprises:
   a third transistor operatively connected to the emitters of said first pair of emitter coupled transistors; and
   a fourth transistor operatively connected to said voltage equalization means, and
   said voltage equalization means comprises:
   a fifth transistor operatively connected between said fourth transistor and the collector of one of the transistors of said first pair of emitter coupled transistors; and
   a sixth transistor operatively connected between said fourth transistor and the collector of the other one of the transistors of said first pair of emitter coupled transistors.

4. A driver as recited in claim 3, wherein said fifth and sixth transistors each have a base supplied with a common voltage.

5. A driver, having an input transmission line and an output transmission line, for transmitting a digital differential signal, as a pair of signals at first and second levels along a transmission line during a packet time and for not transmitting the signal during an idle time, said driver comprising:
   first and second input terminals coupled to the input transmission line for receiving an input signal;
   first and second output terminals coupled to the output transmission line;
   a driving circuit including:
   a first pair of transistors, each transistor having an emitter, the emitters being connected together, and each transistor having a collector; and
   a pair of collector loads operatively connected to the respective collectors of said first pair of transistors, and said driving circuit providing said digital differential signal at the collectors of said first pair of transistors;
   a drive controller including:
   a second pair of transistors, each transistor having an emitter, the emitters being connected together, and each transistor having a collector, and one of the collectors of said second pair of transistors being operatively connected to the emitters of said first pair of transistors;
   a constant current source operatively connected to the emitters of said second pair of transistors; and
   a pair of current separating means, operatively connected to the other one of the collectors of said second pair of transistors and being directly connected to said pair of collector loads, respectively, for causing one-half of the current provided by the constant current source to flow in each of the collector loads of said pair of collector loads to produce a mean voltage value level between said first and second levels at the collectors of said first pair of transistors, and said drive controller supplying the current produced by said constant current source to said driving circuit during the packet time and to said current separating means during the idle time, respectively; and
   a packet time detecting circuit means, operatively coupled to receive said input signal, supplying a first current to the driving circuit by turning on one of the transistors of said second pair of emitter coupled transistors when the level of the input signal received at said first and second input terminals is variable and supplying a second current to said voltage equalization means by turning on the other of the transistors of said second pair of emitter coupled transistors when the input signal is not variable.

6. A driver as recited in claim 5, wherein said current separating means comprises first and second matched diodes each having a cathode connected to the other one of the collectors of said second pair of transistors and each having an anode, the anode of the first matched diode being connected to one of the collector loads of said pair of collector loads and the anode of the second matched diode being connected to the other of the collector loads of said pair of collector loads.

7. A driver as recited in claim 5, wherein said current separating means comprises first and second matched transistors each having an emitter connected to the other one of the collectors of said second pair of transistors and each having a collector, the collector of the first matched transistor being connected to one of the collector loads of said pair of collector loads and the collector of the second matched transistor being connected to the other of the collector loads of said pair of collector loads.

* * * * *